(12) United States Patent
Katsumura et al.

(10) Patent No.: US 9,729,087 B2
(45) Date of Patent: Aug. 8, 2017

(54) VIBRATION POWER GENERATOR, VIBRATION MONITORING DEVICE, AND VIBRATION MONITORING SYSTEM

(71) Applicants: Panasonic Intellectual Property Management Co., Ltd., Osaka (JP); Sumitomo Riko Company Limited, Aichi (JP)

(72) Inventors: Hidenori Katsumura, Hyogo (JP); Hiroshi Kagata, Osaka (JP); Masaya Tamura, Osaka (JP); Koichi Hasegawa, Kasugai (JP); Hajime Kurikuma, Komaki (JP)

(73) Assignees: PANASONIC INTELLECTUAL PROPERTY MANAGEMENT CO., LTD., Osaka (JP); SUMITOMO RIKO COMPANY LIMITED, Aichi (JP)

( * ) Notice: Subject to any disclaimer, the term of this patent is extended or adjusted under 35 U.S.C. 154(b) by 0 days.

(21) Appl. No.: 14/920,101

(22) Filed: Oct. 22, 2015

(65) Prior Publication Data
US 2016/0043663 A1   Feb. 11, 2016

Related U.S. Application Data

(63) Continuation of application No. PCT/JP2014/006122, filed on Dec. 8, 2014.

(30) Foreign Application Priority Data

Dec. 12, 2013   (JP) .................................. 2013-257166

(51) Int. Cl.
*H01L 41/113*   (2006.01)
*H02N 2/18*   (2006.01)

(52) U.S. Cl.
CPC ......... *H02N 2/188* (2013.01); *H01L 41/1136* (2013.01)

(58) Field of Classification Search
CPC ............................... H02N 2/18; H01L 41/113
(Continued)

(56) References Cited

U.S. PATENT DOCUMENTS 7,948,153 B1 * 5/2011 Kellogg .............. H01L 41/1136
310/329
9,525,365 B2 * 12/2016 Katsumura ......... H01L 41/1136
(Continued)

FOREIGN PATENT DOCUMENTS

CN    102412757    4/2012
JP    2011-152004   8/2011
(Continued)

OTHER PUBLICATIONS

Machine Translation of Japanese patent application No. 2011-172351 previously cited in the IDS filed Oct. 22, 2015.
(Continued)

*Primary Examiner* — J. San Martin
(74) *Attorney, Agent, or Firm* — Wenderoth, Lind & Ponack, L.L.P.

(57) ABSTRACT

A vibration power generator includes a vibration system attached to a vibrating member. The vibration system includes a first vibration subsystem, and a second vibration subsystem attached to the first vibration subsystem. The first vibration subsystem includes an elastic member attached to the vibrating member, and a first mass member attached to the elastic member. The second vibration subsystem includes a plate spring integral with a piezoelectric element, and a second mass member attached to the plate spring. The
(Continued)

first vibration subsystem has a resonant frequency that is substantially equal to a resonant frequency of the second vibration subsystem.

14 Claims, 5 Drawing Sheets

(58) Field of Classification Search
USPC .......................................................... 310/339
See application file for complete search history.

(56) References Cited

U.S. PATENT DOCUMENTS

| | | | | |
|---|---|---|---|---|
| 9,647,579 | B2* | 5/2017 | Lee | H02N 2/186 |
| 2008/0264537 | A1* | 10/2008 | Behrends | B60C 23/041 |
| | | | | 152/152.1 |
| 2009/0174289 | A1* | 7/2009 | Tanner | H01L 41/053 |
| | | | | 310/339 |
| 2010/0194240 | A1* | 8/2010 | Churchill | H01L 41/1136 |
| | | | | 310/319 |
| 2011/0148256 | A1* | 6/2011 | Fujimoto | H01L 41/113 |
| | | | | 310/339 |
| 2011/0204752 | A1 | 8/2011 | Gao et al. | |
| 2012/0001518 | A1* | 1/2012 | Moler | H02N 2/043 |
| | | | | 310/319 |
| 2013/0320807 | A1* | 12/2013 | Sakaguchi | H02N 2/188 |
| | | | | 310/339 |
| 2014/0295365 | A1* | 10/2014 | Casset | F03G 7/06 |
| | | | | 432/1 |
| 2014/0327339 | A1* | 11/2014 | Katsumura | H01L 41/1134 |
| | | | | 310/321 |
| 2015/0135869 | A1* | 5/2015 | Jia | H02N 2/188 |
| | | | | 74/96 |
| 2015/0145376 | A1* | 5/2015 | Sun | H01L 41/1134 |
| | | | | 310/339 |
| 2015/0188458 | A1* | 7/2015 | Andosca | F03G 7/08 |
| | | | | 310/319 |
| 2015/0221855 | A1* | 8/2015 | Vaeth | H01L 41/1136 |
| | | | | 310/319 |
| 2015/0295520 | A1* | 10/2015 | Hasegawa | H02N 2/188 |
| | | | | 310/323.01 |

FOREIGN PATENT DOCUMENTS

| | | |
|---|---|---|
| JP | 2011-172351 | 9/2011 |
| WO | 2012/137695 | 10/2012 |
| WO | 2014/141557 | 9/2014 |

OTHER PUBLICATIONS

International Search Report issued Feb. 24, 2015 in International (PCT) Application No. PCT/JP2014/006122, with English translation.

* cited by examiner

VIBRATION POWER GENERATOR, VIBRATION MONITORING DEVICE, AND VIBRATION MONITORING SYSTEM

CROSS-REFERENCE TO RELATED APPLICATIONS

This is a continuation of International Application No. PCT/JP2014/006122 filed on Dec. 8, 2014, which claims priority to Japanese Patent Application No. 2013-257166 filed on Dec. 12, 2013. The entire disclosures of these applications are incorporated by reference herein.

BACKGROUND

The present disclosure relates to a vibration power generator, a vibration monitoring device, and a vibration monitoring system.

A piezoelectric element is an element which induces electric polarization and generates a voltage when a pressure in a specific direction is applied thereto. By utilizing such a piezoelectric element, mechanical displacement is converted into voltage, and power can be thus generated. Common mechanical displacements include vibration. If power can be generated by vibration, electronic devices will be able to be operated almost anywhere without preparing a power supply.

Methods for generating power by vibration include a method using a vibrating piezoelectric material including a piezoelectric element attached to a diaphragm. Unfortunately, in this method, if the resonant frequency of the vibrating piezoelectric material is identical to the frequency of vibration, a large mechanical displacement is obtained, and power can be thus generated, whereas if the resonant frequency differs from the frequency of vibration, power can hardly be generated. For this reason, consideration has been made to extend the range of vibration frequencies within which power can be generated using a plurality of vibrating piezoelectric materials having different resonant frequencies (see, for example, Japanese Unexamined Patent Publication No. 2011-152004).

SUMMARY

Unfortunately, in the conventional method, a plurality of vibrating piezoelectric materials are required. Furthermore, the range of frequencies accommodated by each vibrating piezoelectric material is narrow, and it would be thus difficult to cover a broad frequency band even if a plurality of vibrating piezoelectric materials were provided.

It is an object of the present disclosure to provide a vibration power generator having characteristics in which power is generated in a broad frequency band.

A vibration power generator according to an aspect of the present disclosure includes a vibration system attached to a vibrating member. The vibration system includes a first vibration subsystem, and a second vibration subsystem attached to the first vibration subsystem, the first vibration subsystem includes an elastic member attached to the vibrating member, and a first mass member attached to the elastic member, the second vibration subsystem includes a plate spring integral with a piezoelectric element, and a second mass member attached to the plate spring, and the first vibration subsystem has a resonant frequency that is substantially equal to a resonant frequency of the second vibration subsystem.

In the vibration power generator according to the aspect, a resonance amplification factor of the second vibration subsystem may be greater than a resonance amplification factor of the first vibration subsystem, and a product of the mass of the first mass member and the resonance amplification factor of the first vibration subsystem may be greater than a product of the mass of the second mass member and the resonance amplification factor of the second vibration subsystem.

In the vibration power generator according to the aspect, the mass of the first mass member may be at least five times the mass of the second mass member.

In the vibration power generator according to the aspect, the second vibration subsystem may have a resonant frequency that is higher than or equal to 90% and lower than or equal to 110% of a resonant frequency of the first vibration subsystem.

In the vibration power generator according to the aspect, the piezoelectric element may include a piezoelectric film provided on a surface of the plate spring, and a compressive stress may be applied to the piezoelectric film.

In the vibration power generator according to the aspect, a position of the second mass member on the plate spring may be adjustable.

In the vibration power generator according to the aspect, the first vibration subsystem may include an adjustment mass member attached to the first mass member.

A vibration monitoring device according to another aspect of the present disclosure includes: the vibration power generator of the present disclosure; and a signal transmitter driven by the vibration power generator.

In the vibration monitoring device according to the another aspect, the vibrating member may produce vibrations in a first frequency band when operated normally, and the vibration system may have a resonant frequency that falls within the first frequency band.

In the vibration monitoring device according to the another aspect, the vibrating member may produce vibrations in a second frequency band in an abnormal situation, and the vibration system may have a resonant frequency that falls within the second frequency band.

A vibration monitoring system according to still another aspect of the present disclosure includes the vibration monitoring device of the present disclosure including a plurality of vibration monitoring devices. The vibrating member has a plurality of states to produce vibrations in different frequency bands, and the resonant frequencies of the plurality of vibration systems of the vibration monitoring devices correspond to the different states of the vibrating member.

A vibration power generator according to the present disclosure provides characteristics in which power is generated in a broad frequency band, thus efficiently generating power.

DETAILED DESCRIPTION

Figure 1:
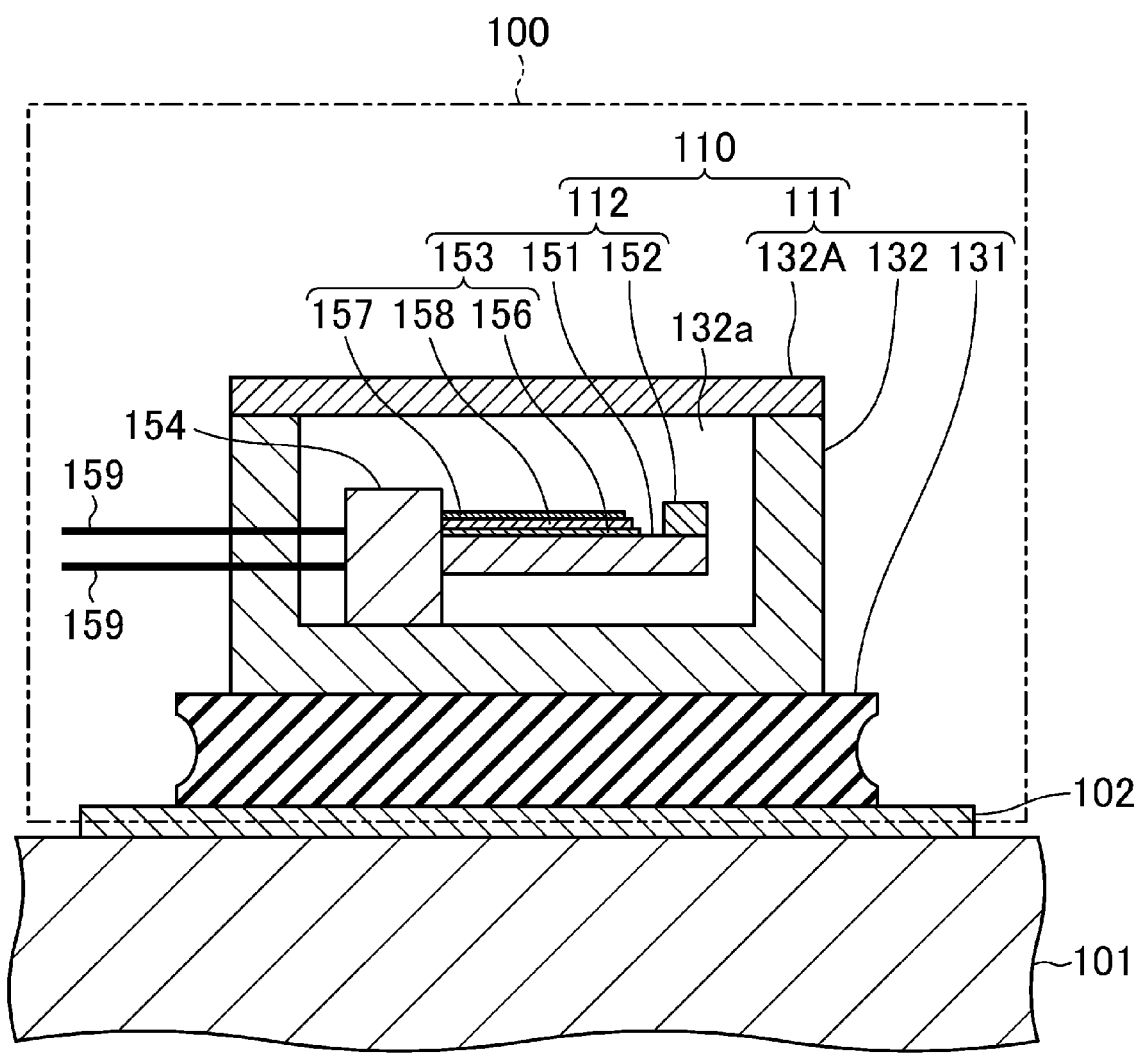
FIG. 1 is a cross-sectional view illustrating a vibration power generator according to an embodiment.

A vibration power generator according to an embodiment has a configuration such as that illustrated in FIG. 1. As illustrated in FIG. 1, a vibration power generator 100 of this embodiment includes a vibration system 110, which is attached to a vibrating member 101 via an adhesive member 102. The orientation of the vibration power generator 100 in use is not limited, but in the following description, the side closer to the vibrating member 101 is regarded as the lower side, and the side facing away from the vibrating member 101 is regarded as the upper side.

The vibrating member 101 includes every member that creates vibrations. Its examples include machinery including conveying machines, machine tools, electric home appliances, and their components, e.g., automobiles, trains, aircraft, refrigerators, and washing machines. Bodies, engines, motors, shafts, mufflers, bumpers, tires, compressors, and fans all used in these machines are also included. Constructions including buildings, roads, and bridges, structural members associated with the constructions, such as poles, walls, and floors, and facilities, such as elevators and ducts, are also included.

The vibration system 110 includes first and second vibration subsystems 111 and 112. The first vibration subsystem 111 includes an elastic member 131 attached to the vibrating member 101, and a first mass member 132 attached to the elastic member 131. The elastic member 131 may be any member as long as it can elastically connect the first mass member 132 to the vibrating member 101. FIG. 1 illustrates an example in which the elastic member 131 is an elastic rubber body in the form of a rectangular block. While, in the example illustrated, the elastic member 131 and the vibrating member 101 are bonded together via the adhesive member 102, they may also be connected together by a bolt or other tools. The elastic member 131 does not need to be a special-purpose member, and a portion of the structure of the vibrating member may be utilized. For example, if the vibrating member 101 is an automobile, an elastic portion of a vibration-damping dynamic damper provided in the automobile can be utilized as the elastic member 131.

The first mass member 132 has a mass to adjust the natural resonant frequency of the first vibration subsystem 111. In FIG. 1, the first mass member 132 has a recess 132a, in which the second vibration subsystem 112 is housed. A lid body 132A is provided to cover the recess 132a, thereby sealing the recess 132a.

The mass $m_1$ of the first mass member 132 is determined based on the required natural resonant frequency of the first vibration subsystem 111. Note that the mass $m_1$ of the first mass member 132 including the lid body 132A can be greater than or equal to 10% of the equivalent mass M of the vibrating member 101 ($m_1 \geq 0.1 \times M$). Then, the first mass member 132 sufficiently affects the vibration state of the vibrating member 101, and functions as a dynamic damper. Thus, vibrations are canceled, thereby reducing vibration of the vibrating member 101 advantageously. Note that the vibration power generator 100 does not need to function as a damper, such as a dynamic damper. In this case, the mass $m_1$ of the first mass member 132 may be less than 10% of the equivalent mass M of the vibrating member 101.

The first mass member 132 can be made of, but not limited to, a material having a high specific gravity. For example, iron can be used. The elastic member 131 and the first mass member 132 may be connected together by a bolt or other tools, or may be bonded together with an adhesive or other materials.

The second vibration subsystem 112 includes a plate spring 151, which is an elastic member, and a piezoelectric element 153 and a second mass member 152 that are arranged on one surface of the plate spring 151. The plate spring 151 can be a longitudinal plate-like metal member made of spring steel, stainless steel for a spring, or any other material. The plate spring 151 is attached at its one end to the first mass member 132 via a fixing member 154. The second mass member 152 is attached to the other end of the plate spring 151. That is, the second mass member 152 is elastically connected to the first mass member 132 via the plate spring 151. Thus, elastic deformation of the plate spring 151 in a thickness direction thereof allows displacement of the second mass member 152 relative to the first mass member 132. As can be seen from the foregoing description, the first and second vibration subsystems 111 and 112 form the vibration system 110 with two degrees of freedom.

In FIG. 1, the plate spring 151 is attached to a side surface of the rectangular-parallelepiped-shaped fixing member 154, and the bottom surface of the fixing member 154 is attached to the bottom surface of the recess 132a. However, this is only an example of the present disclosure, and the second vibration subsystem 112 merely needs to be attached to the first vibration subsystem 111 so that the direction of its vibration is identical to the direction of vibration of the first vibration subsystem 111. A situation where the directions of vibration are identical means that the main directions of vibration are identical, and the phase of vibration may vary. The main directions of vibration mean the directions to provide the largest amount of displacement. A situation where the directions are identical means that the difference between the directions is within ±30°, preferably within ±20°, more preferably within ±10°.

The second mass member 152 has a mass to adjust the natural resonant frequency of the second vibration subsystem 112. The mass $m_2$ of the second mass member 152 is determined based on the required natural resonant frequency of the second vibration subsystem 112. Note that by setting the amplification factor (resonance amplification factor) X at the natural frequency of the first vibration subsystem 111 to be sufficiently lower than the amplification factor (resonance amplification factor) Q at the natural frequency of the second vibration subsystem 112 and setting the mass $m_1$ of the first mass member 132 to be sufficiently higher than the mass $m_2$ of the second mass member 152, an adjustment is desirably made to satisfy the relationship represented by $m_1 \times X > m_2 \times Q$. Making an adjustment in this manner enables an extension of the frequency band in which a large amount of electric power is generated. Furthermore, by setting the mass $m_1$ of the first mass member 132 to be at least five times the mass $m_2$ of the second mass member 152, such an advantage can be further improved.

While, in FIG. 1, the second mass member 152 is attached to an end portion of the plate spring 151, the position to which the second mass member 152 is attached can be changed optionally. By changing the position of the second mass member 152 on the plate spring 151, the natural resonant frequency of the second vibration subsystem 112 can be adjusted. Optionally, the second mass member 152 may also be arranged on a side of the plate spring 151 facing away from the piezoelectric element 153. The second mass member 152 may be attached to the plate spring 151 with an adhesive or any other material, or may be fixed by a bolt or other tools so that the attachment position is adjustable.

The piezoelectric element 153 includes a lower electrode 156, an upper electrode 157, and a piezoelectric layer 158 interposed between the lower and upper electrodes 156 and 157. The external force applied from the vibrating member 101 to the first mass member 132 is transferred to the second mass member 152. Thus, the first and second mass members 132 and 152 are relatively displaced, and the plate spring 151 is elastically deformed. The piezoelectric element 153 is integral with the plate spring 151, and thus, vibrational energy resulting from the relative displacement of the first and second mass members 132 and 152 is input to the piezoelectric element 153. This causes the piezoelectric element 153 to be deformed together with the plate spring 151, thereby generating a voltage. Thus, the vibration power generator of this embodiment converts the vibrational energy into electric energy in accordance with the amount of the relative displacement of the first and second mass members 132 and 152.

Power generated by the piezoelectric element 153 can be extracted from leads 159 each connected to a corresponding one of the lower and upper electrodes 156 and 157. Connecting the leads 159 to an electric circuit allows the power generated by the piezoelectric element 153 to drive the electric circuit. The electric circuit should not be limited to particular circuits, but may be a rectifier circuit, a DC to DC converter circuit, a power storage circuit, a sensor circuit, a radio transmitter/receiver circuit, or any other circuit.

The piezoelectric layer 158 can be a film made of a ceramic material, a monocrystalline material, or any other material. It can be, for example, a film made of lead zirconate titanate, aluminum nitride, lithium tantalite, lithium niobate, or any other material. The piezoelectric layer 158 can be a film to which a compressive stress has been applied. Thus, the piezoelectric layer 158 can be significantly deformed.

The piezoelectric element 153 can be formed, for example, in the following manner. First, a silver-palladium alloy paste layer is screen-printed on the principal surface of the plate spring 151 formed of a heat-resistant stainless steel plate, such as SUS430, containing a small amount of aluminum. Next, a piezoelectric material paste layer containing piezoelectric material composition powder is screen-printed on the silver-palladium alloy paste layer. Next, a silver-palladium alloy paste layer is screen-printed on the piezoelectric material paste layer, thereby forming an unsintered element. Next, the unsintered element is placed in a sintering sheath, and is sintered for two hours at 875° C. In this manner, the silver-palladium alloy paste layers and the piezoelectric material paste layer are sintered and densified. Thus, a sintered element is formed which is integral with the plate spring 151 and includes the lower electrode 156, the piezoelectric layer 158, and the upper electrode 157. Next, a voltage of 100 V is applied between the lower and upper electrodes 156 and 157 for 30 minutes at 120° C. to polarize the piezoelectric layer 158.

The plate spring 151 can have a width of 12.5 mm, a length of 18 mm, and a thickness of 0.1 mm, for example. The silver-palladium alloy paste layers and the piezoelectric material paste layer can each have a width of 12 mm and a length of 12 mm. The sintered lower and upper electrodes 156 and 157 can have a thickness of 5 μm. The sintered piezoelectric layer 158 can have a thickness of 25 μm.

The piezoelectric layer 158 can be made of a material represented by, for example, the following composition formula (1).

$$Pb_{1.015}Zr_{0.44}Ti_{0.46}(Zn_{1/3}Nb_{2/3})_{0.10}O_{3.015} \quad (1)$$

This composition demonstrates excellent piezoelectric properties, and $Pb(Zn_{1/3}Nb_{2/3})O_3$ is substituted for 10 mole percent of the B-site of lead zirconate titanate (PZT). The ratio of the Pb site is 1.015, which is excessively higher than stoichiometry. In this case, piezoelectric material paste can be created in the following manner. Piezoelectric material composition powder is prepared by a solid phase method. The piezoelectric material composition powder has a molar ratio represented by the composition formula (1) and contains, as raw materials, powders of lead oxide (PbO), titanium oxide ($TiO_2$), zirconium oxide ($ZrO_2$), zinc oxide (ZnO), and niobium oxide ($Nb_2O_5$), each of which is at a purity of 99.9% or more. Note that the particle size of the powders should be less than 0.5 μm to allow the sintering temperature of the piezoelectric layer to be less than 900° C.

Next, an organic carrier containing an organic binder and a solvent is prepared. As the organic binder, at least one selected from, for example, an ethyl cellulose resin, an acrylic resin, and a butyral resin can be used. As the solvent, a-terpineol or butyl carbitol, for example, can be used. The organic binder and the solvent can be contained in a ratio of 2:8, for example. The organic carrier and the piezoelectric material composition powder are mixed and kneaded with an appropriate amount of a phosphoric-ester-based dispersant to obtain piezoelectric material paste. The mixing ratio between the organic carrier and the piezoelectric material composition powder can be 20:80, which is the weight ratio therebetween. A triple roll mill, for example, can be used for kneading.

The silver-palladium alloy paste may be paste containing silver-palladium alloy particles containing 90% of silver and 10% of palladium, for example. The particle size of such silver-palladium alloy particles can be about 0.9 μm.

For example, a compressive stress of about 450 MPa is applied to a surface of the piezoelectric layer 158 of the piezoelectric element 153 thus obtained. This is because the heat-resistant stainless steel plate has an average coefficient of thermal expansion as high as about 12 ppm/K relative to about 5 ppm/K of a PZT-based piezoelectric material from room temperature to the sintering temperature (900° C.). The residual stress on the surface of the piezoelectric layer 158 can be determined by polishing away the upper electrode 157 of the piezoelectric element 153 to expose the piezoelectric layer 158, and then measuring the crystal lattice spacing in the exposed surface of the piezoelectric layer 158 by X-ray analysis. To measure the residual stress, the peak with Miller index (111) occurring at an analysis angle 2θ f, for example, about 38° can be used.

Figure 2:
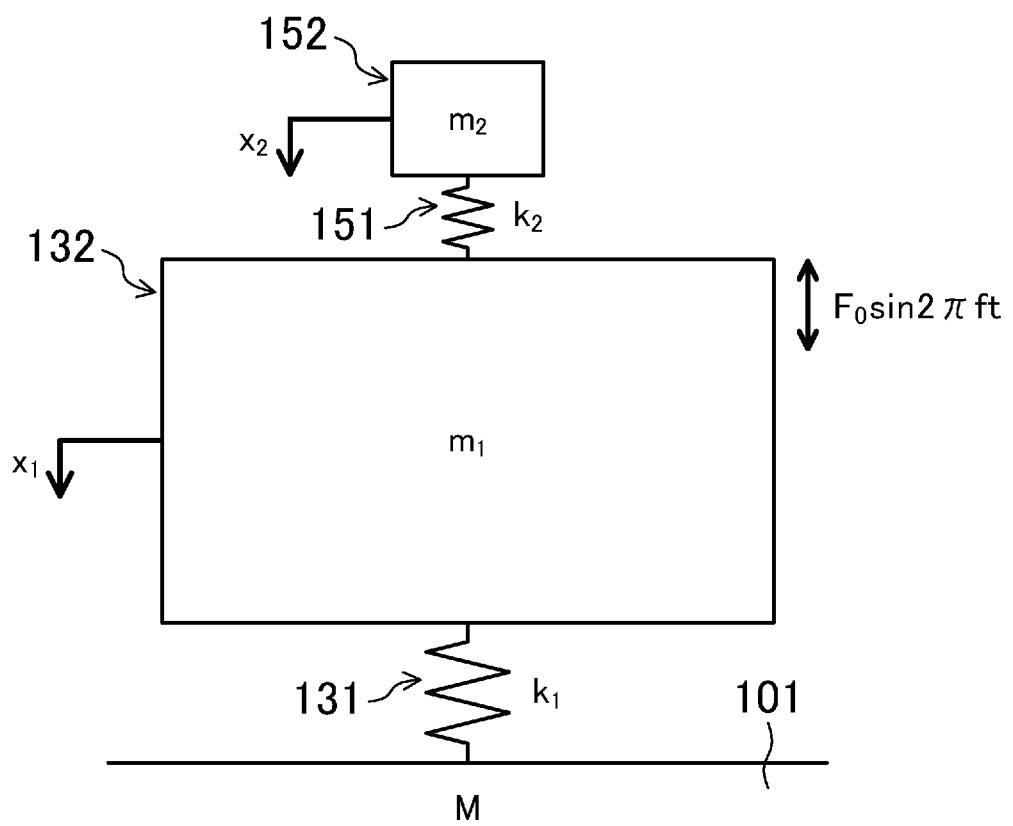
FIG. 2 is a vibration model for explaining the vibration power generator according to the embodiment.

The first and second vibration subsystems 111 and 112 form a multi-degree-of-freedom vibration system that can be represented by such a vibration model as illustrated in FIG. 2. In FIG. 2, $m_1$ denotes the mass of the first mass member 132, $m_2$ denotes the mass of the second mass member 152, $k_1$ denotes the spring constant of the elastic member 131, $k_2$ denotes the spring constant of the plate spring 151, $x_1$ denotes the amount of displacement of the first mass member 132, $x_2$ denotes the amount of displacement of the second mass member 152, and $F_0 \sin 2\pi ft$ denotes the vibration load input from the vibrating member 101 to the vibration power generator 100.

If, in such a multi-degree-of-freedom vibration system, the difference between the mechanical resonant frequency $f_{r1}$ of the first vibration subsystem 111 alone and the mechanical resonant frequency $f_{r2}$ of the second vibration subsystem 112 alone is less than or equal to a certain value, and these frequencies are substantially equal to each other, vibrations of each first/second vibration subsystem 111/112 are transferred to the other one thereof so that these subsystems can be vibrated in a coupled manner. Here, a situation where the resonant frequencies $f_{r1}$ and $f_{r2}$ are substantially equal to each other means that the difference between the frequencies $f_{r1}$ and $f_{r2}$ is within ±15% of the frequency $f_{r1}$, preferably within ±10% thereof, more preferably within ±5% thereof.

If the frequencies of vibrations input from the vibrating member 101 are identical, and the amplitudes thereof are identical, vibrating the first and second vibration subsystems 111 and 112 in a coupled manner allows the amount of displacement $x_2$ of the second mass member 152 to be larger than in the case of vibrating the second vibration subsystem 112 alone. Also, if vibrations at frequencies deviating from the mechanical resonant frequency $f_{r2}$ of the second vibration subsystem 112 alone are input from the vibrating member 101, the second mass member 152 can be significantly displaced, and the frequency band in which a large amount of electric power is generated can be extended.

The resonant frequencies $f_{r1}$ and $f_{r2}$ of the first and second vibration subsystems 111 and 112 may be set to be different from each other within the range described above.

Figure 3:
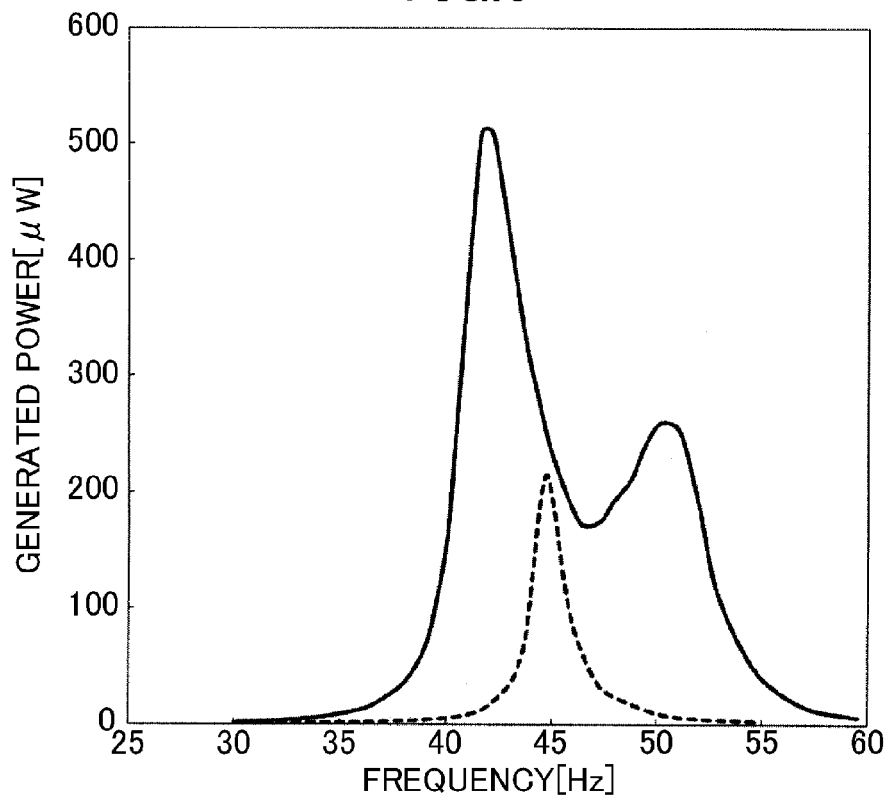
FIG. 3 is a graph showing exemplary power generation characteristics of the vibration power generator according to the embodiment.

FIG. 3 shows the power generation characteristics of the vibration power generator 100 in which the first vibration subsystem 111 having a resonant frequency $f_{r1}$ set to be 45 Hz and the second vibration subsystem 112 having a resonant frequency $f_{r2}$ set to be 44.8 Hz are combined together, and the power generation characteristics of the second vibration subsystem 112 alone having a resonant frequency $f_{r2}$ set to be 44.8 Hz. In FIG. 3, the power generation characteristics of the vibration power generator 100 are shown in a solid line, and the power generation characteristics of the second vibration subsystem 112 alone are shown in a broken line.

The power generation characteristics were measured by vibrating, with a vibrator, the vibration power generator 100 in which the first and second vibration subsystems 111 and 112 are combined together and a power generator composed of the second vibration subsystem 112 alone, and determining the voltage $V_{rms}$ between the leads 159. The power P generated was calculated using $V_{rms}^2/R$. R represents the value of a resistor connected between the leads 159, and was 100 kΩ. The acceleration of vibration applied by the exciter was 0.1 G.

The first vibration subsystem 111 included the elastic member 131 that was an elastic rubber body having a length of 4 cm, a width of 3 cm, and a thickness of 0.5 cm. The mass of the first mass member 132 was 200 g. In a situation where the vibration acceleration was 0.1 G, and the frequency was 45 Hz, the resonance amplification factor of the first vibration subsystem 111 alone was 6.84. The exciter applied vibrations at a predetermined frequency to the first vibration subsystem 111, and the vibration displacements of the exciter and the first vibration subsystem 111 were measured with a laser displacement meter to determine the ratio therebetween, which was the resonance amplification factor of the first vibration subsystem 111. The product of the mass of the first mass member 132 and the resonance amplification factor of the first vibration subsystem 111 alone was 1368.

Note that the elastic rubber body that is the elastic member 131 can be natural rubber, synthetic rubber, or a blend of natural rubber and synthetic rubber. Examples of the synthetic rubber include styrene-butadiene rubber, butadiene rubber, isoprene rubber, chloroprene rubber, isobutylene-isoprene rubber, chlorinated-isobutylene-isoprene rubber, acrylonitrile-butadiene rubber, hydrogenated-acrylonitrile-butadiene rubber, ethylene-propylene-diene rubber, ethylene-propylene rubber, acrylic rubber, and silicone rubber.

The second vibration subsystem 112 included the plate spring 151 having a width of 12.5 mm, a length of 18 mm, and a thickness of 0.1 mm and provided with the piezoelectric element 153, and the second mass member 152 attached to the surface of the plate spring. The piezoelectric element 153 was formed in the manner previously exemplified. The piezoelectric layer 158 was made of a material represented by the composition formula (1), was 12 mm wide and 12 mm long, and had a thickness of 30 μm after being sintered. The mass of the second mass member 152 was adjusted to 9.8 g so that the frequency $f_{r2}$ became equal to 44.8 Hz. The mass of the first mass member 132 was at least 20 times the mass of the second mass member 152, which was sufficiently large. In this situation, the resonance amplification factor of the second vibration subsystem 112 alone was 30.5. Thus, the product of the mass of the second mass member 152 and the resonance amplification factor of the second vibration subsystem 112 alone was 299, which was as sufficiently small as 0.22 times the product of the mass of the first mass member 132 and the resonance amplification factor of the first vibration subsystem 111 alone.

As indicated by the broken line in FIG. 3, in the case of the second vibration subsystem 112 alone, a power of 215 μW was obtained at a resonant frequency $f_{r2}$ of 44.8 Hz. The range in which a power of greater than or equal to 100 μW was generated had a width of 1.8 Hz. In a situation where the first and second vibration subsystems 111 and 112 were combined together as indicated by the solid line in FIG. 3, first and second peaks were recognized. The frequency at the first peak at which the power generated reached its maximum was 41.8 Hz, and the power generated was 510 μW. The frequency at the second peak was 50.1 Hz, and a power of 259 μW was obtained. The range ΔF100 in which a power of greater than or equal to 100 μW was obtained extended over 13.9 Hz. The center frequency F100 of the range in which a power of greater than or equal to 100 μW was obtained was 46.3 Hz.

The power generation characteristics were measured on vibration power generators in each of which the first vibration subsystem 111 having a frequency $f_{r1}$ of 45 Hz and any one of various second vibration subsystems 112 having different frequencies $f_{r2}$ were combined together. The frequency $f_{r2}$ was varied by adjusting the mass and attachment position of a second mass member 152. The mass of the heaviest one of second mass members 152 used here was 15.0 g, and the mass of a first mass member 132 was 13.3 times that of the second mass member 152, which was sufficiently large. The resonance amplification factor of the largest one alone of the second vibration subsystems was 38.2, and the maximum product of the mass and the resonance amplification factor was 402, which was as sufficiently small as 0.29 times the product of the mass of the first mass member 132 and the resonance amplification factor of the first vibration subsystem 111 alone. Table 1 shows a summary of the frequencies $f_{r2}$, power generation characteristics, and other characteristics of the generators used in measurement. In a situation where the frequencies $f_{r1}$ and $f_{r2}$ satisfied the condition that $|f_{r1}-f_{r2}|/f_{r1} \leq 0.1$, i.e., in a situation where the frequency $f_{r2}$ was higher than or equal to 90% and lower than or equal to 110% of the frequency $f_{r1}$, the range ΔF100 in which a power of greater than or equal to 100 μW was obtainable extended over 10 Hz or more.

TABLE 1

| UNIT | SECOND VIBRATION SUBSYSTEM ALONE | | | COMBINATION | | | |
|---|---|---|---|---|---|---|---|
| | $f_{r2}$ Hz | PEAK μW | ΔF100 Hz | FIRST PEAK μW | SECOND PEAK μW | F100 Hz | ΔF100 Hz |
| 1 | 28.2 | 480 | 2.4 | 774 | 35 | 28.7 | 3.4 |
| 2 | 32.4 | 429 | 2.2 | 827 | 34 | 23.1 | 3.9 |
| 3 | 35.7 | 245 | 2.3 | 696 | 80 | 35.3 | 5.2 |
| 4 | 38.3 | 208 | 2.0 | 650 | 108 | 37.8 | 6.0 |
| 5 | 38.8 | 299 | 1.9 | 802 | 120 | 38.3 | 6.0 |
| 6 | 40.0 | 281 | 2.1 | 720 | 151 | 40.8 | 7.6 |
| 7 | 41.0 | 281 | 2.0 | 720 | 192 | 43.8 | 13.3 |
| 8 | 44.2 | 245 | 2.0 | 562 | 231 | 46.1 | 13.4 |
| 9 | 44.8 | 215 | 1.8 | 510 | 259 | 46.3 | 13.9 |
| 10 | 46.0 | 180 | 1.8 | 500 | 281 | 47.0 | 14.0 |
| 11 | 46.3 | 192 | 2.0 | 451 | 297 | 47.3 | 13.8 |
| 12 | 49.4 | 231 | 2.1 | 238 | 328 | 49.0 | 14.5 |
| 13 | 50.1 | 211 | 1.8 | 192 | 238 | 45.3 | 6.5 |
| 14 | 53.8 | 125 | 1.4 | 95 | 238 | 57.3 | 5.0 |

Figure 4:
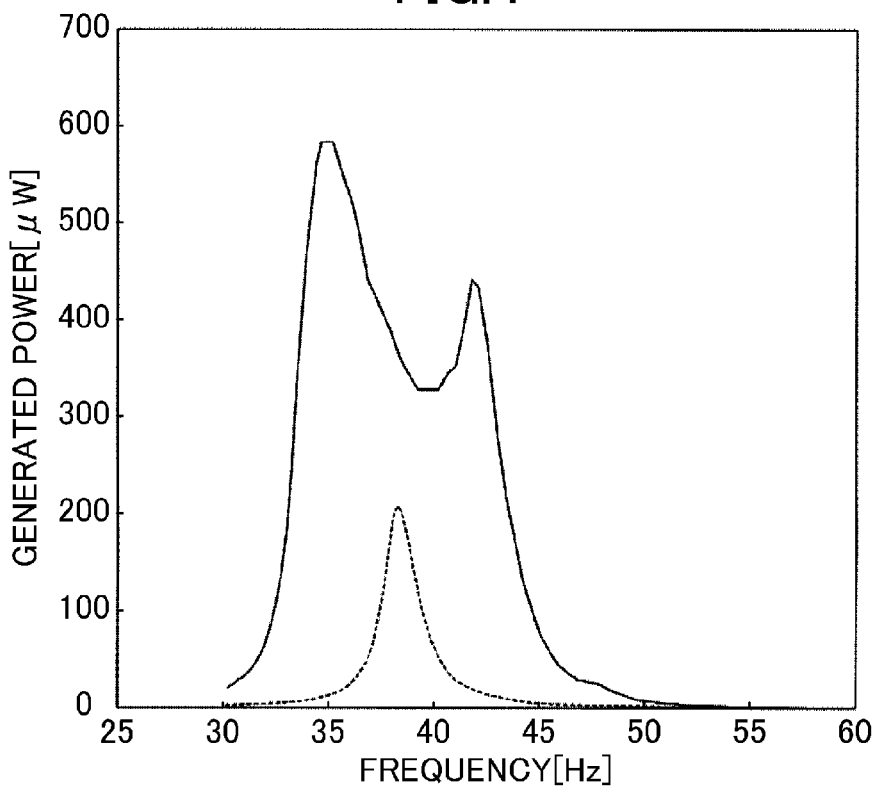
FIG. 4 is a graph showing exemplary power generation characteristics of the vibration power generator according to the embodiment.

FIG. 4 shows the power generation characteristics of a vibration power generator that includes, in combination, a first vibration subsystem 111 including a first mass member 132 with a mass of 300 g and having a frequency $f_{r1}$ of 38.1 Hz and a resonance amplification factor of 7.06, and a second vibration subsystem 112 including a second mass member 152 with a mass of 10.5 g and having a frequency $f_{r2}$ of 38.3 Hz and a resonance amplification factor of 25. The product of the mass of the first mass member 132 and the resonance amplification factor of the first vibration subsystem 111 alone was 2118. The product of the mass of the second mass member 152 and the resonance amplification factor of the second vibration subsystem 112 alone was 263. The ratio between these products was 0.12, which was sufficiently small.

As indicated by the broken line in FIG. 4, in the case of the second vibration subsystem 112 alone, a power of 208 μW was obtained at a frequency $f_{r2}$ of 38.3 Hz. The range ΔF100 in which a power of greater than or equal to 100 μW was obtained had a width of 2.1 Hz. In a situation where the first and second vibration subsystems 111 and 112 were combined together as indicated by the solid line in FIG. 4, the power generated reached its maximum value at 34.9 Hz, and this value was 583 μW. Another peak was recognized also at 41.8 Hz, and a power of 442 μW was obtained. The range ΔF100 in which a power of greater than or equal to 100 μW was obtained extended over 12.4 Hz. The center frequency F100 of the range in which a power of greater than or equal to 100 μW was obtained was 38.5 Hz.

Figure 7:
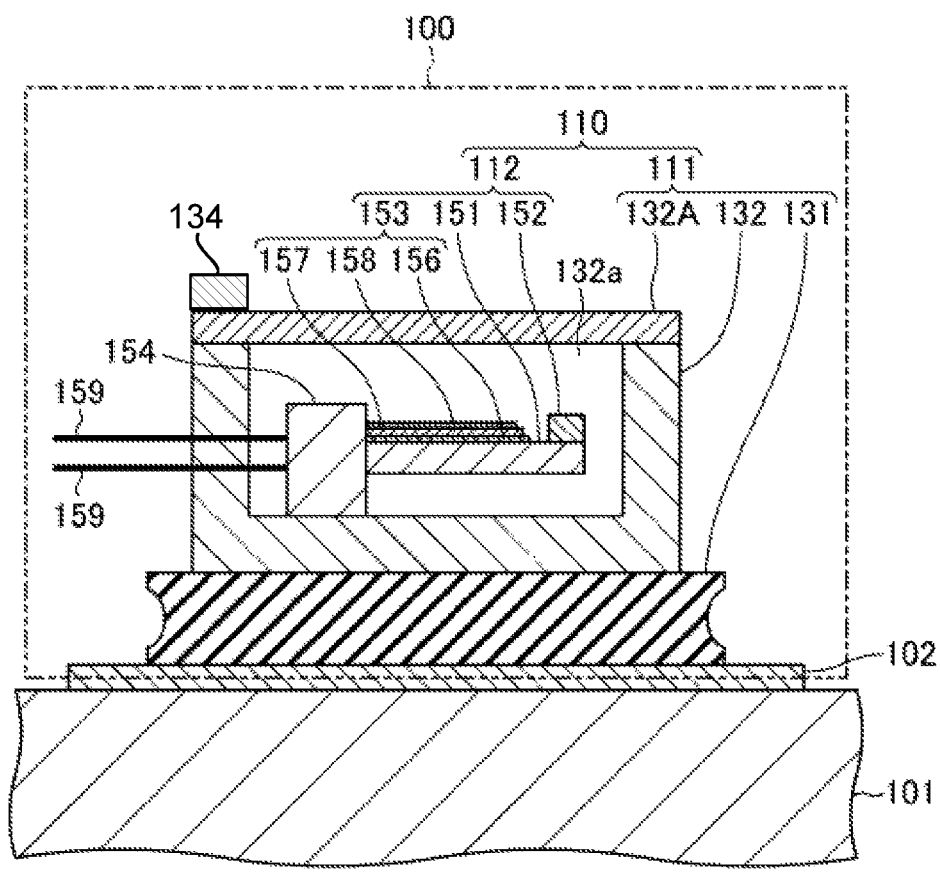
FIG. 7 is a cross-sectional view illustrating a vibration power generator according to an embodiment.

By varying at least one of the natural resonant frequency $f_{r1}$ of the first vibration subsystem 111 and the natural resonant frequency $f_{r2}$ of the second vibration subsystem 112, the frequency at which the maximum power is obtained can be varied. The frequency range ΔF100 in which a power of greater than or equal to 100 μW is obtained can also be varied. The frequency $f_{r1}$ can be adjusted by varying the mass of the first mass member 132. The mass of the first mass member 132 may be varied by varying the size or material thereof, or may also be varied, for example, by attaching an adjustment mass member 134 to the first mass member 132 as shown in FIG. 7. The frequency $f_{r2}$ can be adjusted by varying at least one of the mass and attachment position of the second mass member 152.

Figure 5:
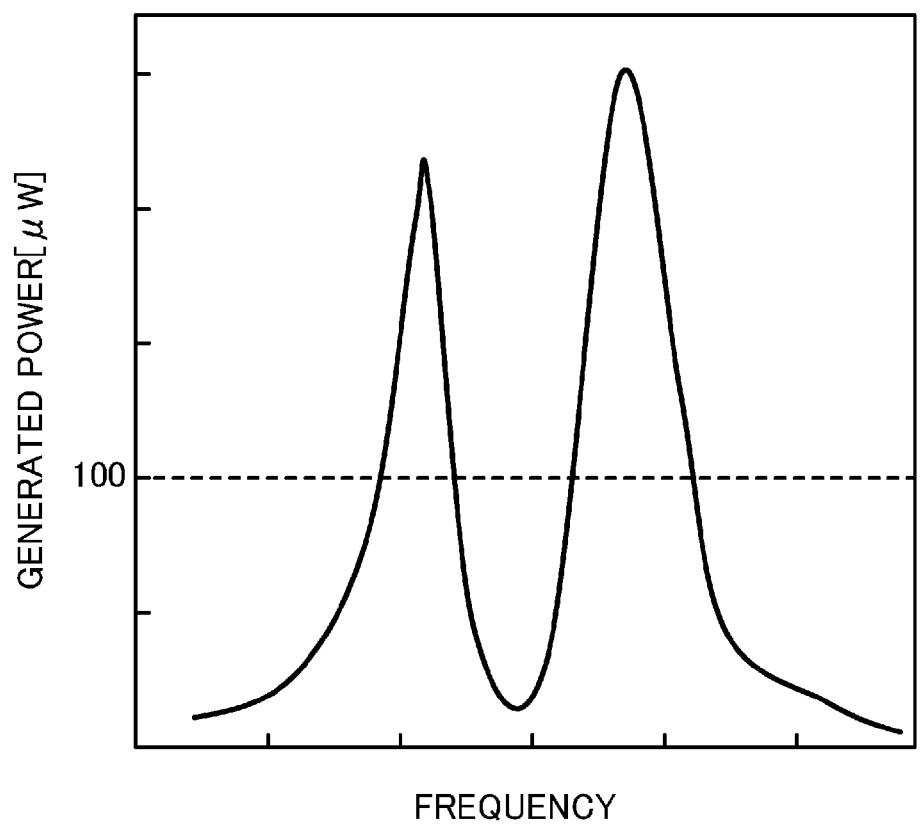
FIG. 5 is a graph showing exemplary power generation characteristics of the vibration power generator according to the embodiment.

On the other hand, if the resonance amplification factors of the first and second vibration subsystems 111 and 112 are substantially equal to each other, or if the resonance amplification factor of the first vibration subsystem 111 is greater than that of the second vibration subsystem 112, power generation-frequency characteristics as shown in FIG. 5 are obtained in which two sharp peaks appear, and the power generated decreases in a frequency range between the peaks. For this reason, the frequency range ΔF100 in which a power of greater than or equal to 100 μW is obtained is divided. If the resonance amplification factor of the second vibration subsystem 112 is greater than that of the first vibration subsystem 111, and the mass of the first mass member 132 is too small, or the mass of the second mass member 152 is too large, the phenomenon identical or similar to that described above occurs. The reason for this is that the product of the mass of the first mass member 132 and the resonance amplification factor of the first vibration subsystem 112 is less than that of the mass of the second mass member 152 and the resonance amplification factor of the second vibration subsystem 112.

While, in this embodiment, the range in which a power of 100 μW is obtained has been described, the power generated varies according to the amplitude of vibrations to be input and the size of the vibration power generator. Furthermore, the amount of power required varies according to the electric circuit driven by the vibration power generator. Thus, a generated power of greater than or equal to 100 μW merely represents a reference value, and the range of power generated by the vibration power generator can be set according to the conditions of actual installation and use.

The vibration power generator of this embodiment is useful, in particular, when combined with a vibrating member having a varying vibration frequency. The vibration power generator of this embodiment can be attached to, for example, a washing machine the vibration frequency of which varies according to the amount of laundry and other conditions, a refrigerator the vibration frequency of which varies according to the operating conditions of a freezer and other conditions, or an automobile the vibration frequency of which varies according to the running conditions, road surface conditions, and other conditions.

Figure 6:
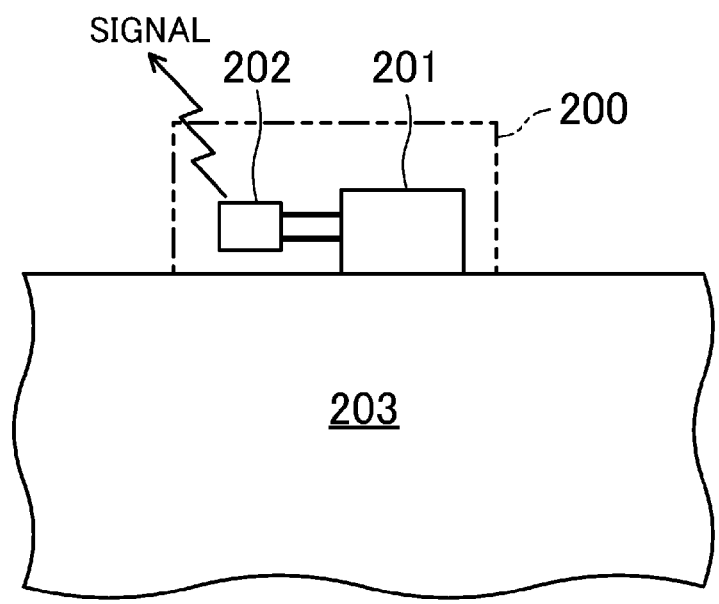
FIG. 6 is a block diagram illustrating a vibration monitoring device according to the embodiment.

Furthermore, the vibration power generator of this embodiment can be used as a monitor for, for example, various devices and facilities even if not combined with a sensor or any other device. For example, as illustrated in FIG. 6, combining a vibration power generator 201 generating power by vibrations in a predetermined frequency range and a wireless module 202 together can provide a vibration monitoring device 200. By matching the frequency range in which the vibration power generator 201 generates power to the range of vibrations occurring while a device 203 is operating normally, normal operation of the device 203 can be monitored. In this case, if the device 203 is operated normally, power is generated by vibrations, and thus, a signal is transmitted. On the other hand, if an abnormal situation occurs, and the frequency of vibrations deviates from a normal range, power may not be generated, or the power generated may decrease, and thus, no signal is transmitted.

A receiver can receive signals transmitted from the vibration monitoring device 200. If the wireless module can be driven by a power of about 100 μW, the receiver can be placed about 100 m away from the monitoring device in a clearly visible area. Note that signals may be transmitted through wires.

The range in which a power of greater than or equal to 100 μW is obtained by a conventional vibration power generator merely extends over several Hz. Thus, if the frequency of vibrations deviates only slightly from this range, signals will stop. However, the range in which a power of greater than or equal to 100 μW is obtained by the vibration power generator of this embodiment extends over 10 Hz or more, and thus, can cover the range of vibrations in a normal operating state.

Signals may be successively transmitted, or may be transmitted at predetermined timings. Signals to be transmitted may also include data such as a module number or positional information. This enables simultaneous control of multiple devices and other multiple components. Optionally, a plurality of vibration power generators may be attached to a single device or any other component. When a plurality of vibration power generators are attached to a single device or any other component, the vibration power generators generating power in different frequency ranges can be attached. If the device or component is large, the frequency of vibrations may vary from region to region. If the vibration power generators generating power in different frequency ranges are attached, regions of the device or component can be individually monitored. If the frequency range of vibrations is wide, a plurality of vibration power generators generating power in different frequency ranges can be attached. Information on the on-off status of the power supply of the device that is a vibrating member, for example, may be combined with information on vibrations. Thus, a determination can be easily made whether a regular stop of the device has caused a signal to stop.

While, in the example described, the frequency range in which power is generated was matched to the frequency range in which the device is operating normally, it may be matched to the frequency range in which an abnormal situation has occurred in the device. In this case, a signal is transmitted when an abnormal situation has occurred in the device. A vibration power generator generating power in the frequency range in which the device is operating normally and a vibration power generator generating power in the frequency range in which an abnormal situation has occurred may be provided. If the device has a plurality of operating states in which the frequency of vibrations varies, a plurality of vibration power generators may also be provided to correspond to the individual operating states.

A vibration monitoring device can be attached to any object such as an appliance, a device, a facility, or a building that may vibrate. For example, vibrations of an appliance, a device, a facility, or any other object with a component such as a motor or an engine can be monitored. Specifically, vibrations of a compressor, a pump, a fan, a refrigerator, a washing machine, a cleaner, an air conditioner, an automobile, or any other machine can be monitored. Vibrations of a construction such as a bridge or a road can also be monitored.

In the case of an automobile, overall vibrations can be detected by attaching a vibration monitoring device to, for example, a body. Components such as an engine and a shaft can also be individually monitored by attaching a vibration monitoring device to each component. The life of the entire device or each component can also be predicted by the monitoring. For example, attaching a vibration monitoring device to a muffler allows a prediction to be made that the muffler may drop off, for example. Furthermore, by detecting vibrations resulting from a strong impact, a crash or other accidents can be detected. Optionally, a vibration monitoring device may be combined with a sensor to detect characteristics except vibrations. For example, a defect in a tire can be detected by attaching a vibration monitoring device to the tire or a shaft. In this case, those pieces of information may be combined with the pneumatic pressure, temperature, or other characteristics by separately monitoring such characteristics. The vibration power generator may drive a pneumatic pressure sensor, a temperature sensor, or other sensors.

The vibration power generator of this embodiment may constitute a multi-degree-of-freedom vibration system having three or more degrees of freedom by including three or more mass members elastically connected in series via spring members. According to this vibration power generator, high power generation efficiency can be achieved in a broader frequency band of vibration input. If a multi-degree-of-freedom vibration system having three or more degrees of freedom is used, two of the mass members elastically connected to each other may be selected, and a power generating element may be arranged only between the selected mass members. Optionally, a power generating element may be arranged between each pair of mass members arranged adjacent to each other and elastically connected to each other.

Optionally, for example, a first mass member may be elastically connected in parallel to two or more second mass members via two or more independent second spring members to form a multi-degree-of-freedom vibration system of a power generator. According to this configuration, a plurality of second vibration subsystems are formed. Thus, by allowing these second vibration subsystems alone to have different mechanical natural frequencies, power can be effectively generated in a broader frequency band of vibration input, whereas by allowing these second vibration subsystems alone to have an identical mechanical natural frequency, power generation efficiency can be enhanced in a specific frequency band of vibration input.

The piezoelectric element may be replaced with a power generating element such as an electrostrictive element, a magnetostrictive element, or any other suitable element. A power generation structure including an electret, a solenoid-operated system in which a variation of cross flux with time is used, or any other system may also be used. While, in the example described, a plate spring is used as the second vibration subsystem, the plate spring may also be replaced with a coil spring, an elastic rubber body, a torsion bar, or any other tool.

The vibration power generator of the present disclosure is useful as, for example, a vibration power generator that can cover a broad frequency band and generates power by wide vibrations, or a vibration monitoring device and a vibration monitoring system for monitoring wide vibrations.

What is claimed is:
1. A vibration power generator comprising:
   a vibration system attached to a vibrating member; wherein
   the vibration system includes a first vibration subsystem, and a second vibration subsystem attached to the first vibration subsystem,
   the first vibration subsystem includes a first mass member and a first elastic member configured to elastically couple the first mass member to the vibrating member,
   the second vibration subsystem includes a plate spring integral with a piezoelectric element, and a second mass member attached to the plate spring,
   the first vibration subsystem has a resonant frequency that is substantially equal to a resonant frequency of the second vibration subsystem, a resonance amplification factor of the second vibration subsystem is greater than a resonant amplification factor of the first vibration subsystem, a product of a mass of the first mass member and the resonance amplification factor of the first vibration subsystem is greater than a product of a mass of the second mass member and the resonance amplification factor of the second vibration subsystem, and the first elastic member is an elastic rubber body in a form of a block.

2. The vibration power generator of claim 1, wherein the mass of the first mass member is at least five times the mass of the second mass member.

3. The vibration power generator of claim 1, wherein the second vibration subsystem has a resonant frequency that is higher than or equal to 90% and lower than or equal to 110% of a resonant frequency of the first vibration subsystem.

4. The vibration power generator of claim 1, wherein the piezoelectric element includes a piezoelectric film provided on a surface of the plate spring, and a compressive stress is applied to the piezoelectric film.

5. The vibration power generator of claim 4, wherein the piezoelectric film has a lower coefficient of thermal expansion than the plate spring.

6. The vibration power generator of claim 5, wherein the compressive stress is a residual stress caused by a difference between coefficients of thermal expansion of the plate spring and the piezoelectric film.

7. The vibration power generator of claim 1, wherein a position of the second mass member on the plate spring is adjustable.

8. The vibration power generator of claim 1, wherein the first vibration subsystem includes an adjustment mass member attached to the first mass member.

9. The vibration power generator of claim 1, wherein the second vibration subsystem has a resonant frequency that is higher than or equal to 95% and lower than or equal to 105% of a resonant frequency of the first vibration subsystem.

10. The vibration power generator of claim 1, wherein a direction of vibration of the first vibration subsystem is substantially identical to a direction of vibration of the second vibration subsystem.

11. A vibration monitoring device comprising:
a vibration power generator; and
a signal transmitter driven by the vibration power generator, wherein
the vibration power generator comprises a vibration system attached to a vibrating member,
the vibration system includes a first vibration subsystem, and a second vibration subsystem attached to the first vibration subsystem,
the first vibration subsystem includes a first mass member, and a first elastic member configured to elastically couple the first mass member to the vibrating member,
the second vibration subsystem includes a plate spring integral with a piezoelectric element, and a second mass member attached to the plate spring,
the first vibration subsystem has a resonant frequency that is substantially equal to a resonant frequency of the second vibration subsystem,
a resonance amplification factor of the second vibration subsystem is greater than a resonant amplification factor of the first vibration subsystem,
a product of a mass of the first mass member and the resonance amplification factor of the first vibration subsystem is greater than a product of a mass of the second mass member and the resonance amplification factor of the second vibration subsystem, and
the first elastic member is an elastic rubber body in a form of a block.

12. The vibration monitoring device of claim 11, wherein the vibrating member has a first operating states to produce vibrations in a first frequency band, and the vibration system has a resonant frequency that falls within the first frequency band.

13. The vibration monitoring device of claim 11, wherein the vibrating member has a first operating state to produce vibrations in a first frequency band, and the vibrating member has a second operating state to produce vibrations in a second frequency band, and the vibration system has a resonant frequency that falls within the second frequency band.

14. A vibration monitoring system comprising:
a plurality of vibration monitoring devices, wherein
each of the vibration monitoring devices includes:
a vibration power generator; and
a signal transmitter driven by the vibration power generator,
the vibration power generator comprises a vibration system attached to a vibrating member,
the vibration system includes a first vibration subsystem, and a second vibration subsystem attached to the first vibration subsystem,
the first vibration subsystem includes a first mass member, and a first elastic member configured to elastically couple the first mass member to the vibrating member,
the second vibration subsystem includes a plate spring integral with a piezoelectric element, and a second mass member attached to the plate spring,
the first vibration subsystem has a resonant frequency that is substantially equal to a resonant frequency of the second vibration subsystem,
a resonance amplification factor of the second vibration subsystem is greater than a resonant amplification factor of the first vibration subsystem,
a product of a mass of the first mass member and the resonance amplification factor of the first vibration subsystem is greater than a product of a mass of the second mass member and the resonance amplification factor of the second vibration subsystem,
the first elastic member is an elastic rubber body in a form of a block,
the vibrating member has a plurality of states to produce vibrations in different frequency bands, and
the resonant frequencies of the vibration systems of the vibration monitoring devices correspond to the different states of the vibrating member.

* * * * *